US005405654A

United States Patent [19]

Gabor et al.

[11] Patent Number: 5,405,654

[45] Date of Patent: Apr. 11, 1995

[54] SELF-CLEANING CHEMICAL VAPOR DEPOSITION APPARATUS AND METHOD

[75] Inventors: Thomas Gabor, Maplewood; James M. O'Kelly, St. Paul; Joseph H. Eaton, Roseville, both of Minn.

[73] Assignee: Minnesota Mining and Manufacturing Company, St. Paul, Minn.

[21] Appl. No.: 989,223

[22] Filed: Dec. 11, 1992

Related U.S. Application Data

[63] Continuation-in-part of Ser. No. 383,923, Jul. 21, 1989, Pat. No. 5,364,660.

[51] Int. Cl.[6] .......... B05D 3/12

[52] U.S. Cl. .......... 427/356; 427/357; 419/24; 428/408

[58] Field of Search .......... 419/29, 28, 11, 12, 419/408; 427/356, 357

[56] References Cited

U.S. PATENT DOCUMENTS

| | | | |
|---|---|---|---|
| 3,212,926 | 10/1965 | Morelock | 117/126 |
| 3,346,414 | 10/1967 | Ellis et al. | 117/106 |
| 3,549,424 | 12/1970 | Rice | 148/63 |
| 3,580,731 | 5/1971 | Milweski et al. | 117/66 |
| 3,668,062 | 6/1972 | Shyne et al. | 161/177 |
| 4,068,037 | 1/1978 | DeBolt et al. | 428/368 |
| 4,096,823 | 6/1978 | Schladitz | 118/48 |
| 4,097,624 | 6/1978 | Schladitz | 427/251 |
| 4,214,037 | 7/1980 | Galasso et al. | 428/367 |
| 4,343,836 | 8/1982 | Newkirk et al. | 427/249 |
| 4,356,212 | 10/1982 | Stafford | 427/175 |
| 4,358,473 | 11/1982 | DeBolt et al. | 427/10 |
| 4,373,006 | 2/1983 | Galasso et al. | 428/368 |
| 4,584,206 | 4/1986 | Sleighter | 417/109 |
| 4,642,271 | 2/1987 | Rice | 428/698 |
| 4,731,298 | 3/1988 | Shindo et al. | 428/611 |
| 4,732,779 | 3/1988 | Towata et al. | 427/57 |
| 4,756,791 | 6/1988 | D'Angelo et al. | 156/610 |
| 4,834,020 | 5/1989 | Bartholomew et al. | 118/719 |
| 4,849,260 | 7/1989 | Kusumoto et al. | 427/250 |
| 4,859,503 | 8/1989 | Bouix et al. | 427/249 |
| 4,880,600 | 11/1989 | Moskowitz et al. | 419/12 |
| 5,073,413 | 12/1991 | Koppernae et al. | 427/356 |
| 5,272,132 | 12/1993 | Gyorgy et al. | 505/1 |

FOREIGN PATENT DOCUMENTS

| | | |
|---|---|---|
| 0184317 | 11/1986 | European Pat. Off. . |
| 0222960 | 5/1987 | European Pat. Off. . |
| 0249927 | 12/1987 | European Pat. Off. . |
| 2607840 | 12/1986 | France . |
| 1257000 | 12/1986 | Japan . |
| 1291498 | 12/1986 | Japan . |
| 2003098 | 1/1987 | Japan . |

OTHER PUBLICATIONS

Tibbetts et al., "Carbon Fibers Grown From The Vapor Phase: A Novel Material," SAMPE Journal, Sep./Oct. 1986, pp. 30–35.

Christiansen et al., "Turbulent Jets in Chemical-Vapor Deposition," Chemical Engineering Process, Dec. 1988, pp. 18–22.

Egashira et al., "Preparation of Carbonaceous Material Whiskerized With Carbon Fibers (Part 3)", Sekiyu Gakkaishi, vol. 28, No. 5 (1985) p. 412.

"Specialty Ceramics & Composites in Ube Group" (1988) p. 3.

Blocher, J. M., Jr., "Deposition Technologies for Films and Coatings," Noyes Publications, pp. 335–364 (1982).

Honjo et al., *Composite Interfaces, Proc. Int. Conf. 1st.*, pp. 101–107 (1986).

Aggour et al., *Carbon,* vol. 12, pp. 358–362 (1974).

Amateau, *J. Compos. Matter,* vol. 10, pp. 279–296 (1976).

Kato, et al., *Journal of Crystalline Growth,* vol. 37, (1977) pp. 293–300.

H. Schlichting, "Boundary Layer Theory", pp. 159–162 and 500–502, Pergamon Press (1955).

*Primary Examiner*—Peter A. Nelson

*Attorney, Agent, or Firm*—Gary L. Griswold; Walter N. Kirn; Gregory D. Allen

[57] ABSTRACT

A self-cleaning chemical vapor deposition (CVD) apparatus and method allow CVD reactors to operate long periods of time without manual removal of extraneous materials such as soot and fuzz. The apparatus is made self-cleaning by superposing a scraping member having a surface, such as a glass rod, over an inner surface of a reactor, and effecting relative movement between the inner surface and scraping member surface. Preferably the reactor is tilted at an angle to horizontal to enhance removal of extraneous material.

23 Claims, 1 Drawing Sheet

23 9 19 21 25 3 21 23 51 7 2' 37 13 49 12 43 33 51 47 2 5 11 1 15 17 35 41 29 23 39 45 21 27 21 31

SELF-CLEANING CHEMICAL VAPOR DEPOSITION APPARATUS AND METHOD

CROSS-REFERENCE TO RELATED APPLICATIONS

This application is a continuation-in-part of application Ser. No. 07/383,923, filed Jul. 21, 1989, now U.S. Pat. No. 5,364,660.

BACKGROUND OF THE INVENTION

1. Field of the Invention

The present invention relates to the coating of fibers by CVD to make them more suitable for use in fiber-reinforced composites. More, specifically, the present invention concerns a method and an apparatus by which CVD coatings can be applied to fibers more efficiently and economically.

2. Description of Related Art

High-performance fibers are being increasingly used as the reinforcement of plastic, metal, ceramic, and carbon matrix composites. An important role of the fibers is to toughen the composite to prevent brittle failure. The degree of toughness attained is greatly affected by the bond strength between the fibers and matrix. If the bond strength is too high, the cracks propagate through the fibers; if too low, the load is not transferred to them. At an optimum bond strength, crack propagation is hindered by energy dissipation due to pullout.

The most demanding of these applications are those involving high operating temperatures. In such environments, the matrix may chemically react with, or dissolve the fiber. Although chemical reaction may in some cases be beneficial, it usually leads to drastic reductions in strength and toughness.

In many cases, problems encountered at high-temperatures can be solved by applying barrier coatings on the fibers, a favored technique being chemical vapor deposition (CVD). As the name implies, CVD involves the deposition of coatings onto substrates by chemical reaction from the vapor phase.

A typical process for applying barrier coatings onto fibrous substrates is to move the fibrous substrate through a CVD reactor in the presence of reagent gases, preferably while heating the gases. Difficulties encountered in the CVD technique of applying barrier coatings to fibrous substrates include:

(1) soot particles form by homogeneous nucleation and growth and many of them deposit on the reactor inner wall or liner inner wall, if a liner is used; and (2) most fibers, prior to coating, contain at least some broken filaments ("fuzz"); some filaments break during the coating process, and some of the fuzz becomes attached to the innermost surface of the reactor assembly by CVD and then break away from the moving fiber.

Regarding the first problem, the rate of soot formation is slow if a low pressure CVD system is used. However, the rate is pronounced in atmospheric pressure CVD (APCVD) systems, and the rate increases with increasing partial pressure(s) of reagent(s). As economic considerations dictate high fiber throughput, high partial pressures are preferred.

As for the problem presented by broken filaments, the process of the fuzz becoming attached to the reactor inner wall by CVD and then breaking away from the moving fiber accelerates as the fuzz already attached to the reactor inner wall "catches" additional broken filaments entering the reactor. The "fuzzballs" (i.e., a combination of soot and fuzz) thus formed deplete reagents by serving as substrates for CVD. If not removed periodically or held to de minimis size, the moving fibrous substrate may rub against stationary fuzzballs and may even break.

In both subatmospheric (i.e. below atmospheric pressure) and atmospheric pressure CVD coating of fibers, fuzzballs are typically periodically manually removed.

The parent application (Ser. No. 07/383,923) provides an apparatus by which a coating can be continuously applied by APCVD to a multiplicity of filaments or fibers such as a tow of monofilaments or a yarn or a strip of woven fabric. Such a multiplicity of filaments or fibers is sometimes hereinafter referred to as "the fibrous material."

Briefly, the apparatus of the Ser. No. 07/383,923 application includes:

a furnace, a straight, elongated furnace tube extending through the furnace, which furnace tube is formed with

- a uniform inside diameter of sufficiently large size to receive a tool for periodic cleaning while the apparatus is in use,
- an unconstricted outlet,
- an ambient-atmosphere-excluding (preferably constricted) inlet through which the fibrous material enters, and
- intake means for receiving a gaseous mixture comprising one or more reagents and carrier gas (herein referred to as "gaseous mixture") that can coat the fibrous material by CVD.

The furnace tube can be fitted with an elongated hollow cylindrical liner that is easily replaced simply by pulling it through the outlet. In this way deposits are eliminated without disturbing either the inlet for the fibrous material or the intake means. The replacement is performed when deposits on the liner inner surface unduly constrict the open cross-sectional area of the liner. A tool may be periodically inserted into the reactor tube, when it is desired not to utilize a liner, or into the liner, to remove soot and fuzzballs. However, when the apparatus of the Ser. No. 07/383,923 application has been used to coat a ceramic tow or other fibrous material, it has been necessary to use a cleaning tool to remove fuzzballs and soot in some instances as often as every ten minutes.

SUMMARY OF THE INVENTION

The present invention provides a self-cleaning CVD apparatus and method by which coatings can be continuously applied by CVD to inorganic (including carbon) fibrous materials such as tow, yarn, or a strip of woven fabric. As used herein the term "self-cleaning" means that the apparatus can be operated continuously without stopping for removal of extraneous debris (soot and fuzzballs) before it is necessary to stop the process for some other reason, such as to change spools of feed or product fibrous substrate, time constraints, and the like. As compared with known CVD fiber coating apparatus and methods, that of the present invention substantially eliminates the buildup of extraneous debris in CVD reactors and the need for its periodic manual removal.

One embodiment of the self-cleaning CVD apparatus of the invention comprises:

- a reactor assembly having an inner surface defining an elongate through passageway, the elongate passageway having an axis and opposite axially spaced first and second ends;
- means for progressively moving the elongate inorganic fibrous substrate axially through the elongate passageway from the first end toward the second end;
- means for introducing into the passageway a gaseous mixture adapted to deposit a coating on the inorganic fibrous substrate;
- an elongate scraping member having a peripheral surface and extending axially of the passageway along one side of said inner surface with a longitudinally extending portion of the peripheral surface of the scraping member in superposed position relative to a longitudinal axially extending portion of the inner surface; and
- means for causing relative revolving movement between the inner surface and the elongate scraping member around the axis of the passageway to progressively change the longitudinal axially extending portion of the inner surface adjacent the scraping member and cause extraneous debris along the inner surface to be progressively scraped away by the scraping member.

A preferred self-cleaning apparatus according to the invention is that wherein:

- the inner surface is generally cylindrical;
- the reactor assembly comprises a fixed elongate outer tube having opposite ends and a through opening around the axis axially extending between the ends;
- an elongate liner tube having the inner surface, means for mounting the liner tube within the opening in the outer tube for rotational movement around the axis relative to the outer tube and to the scraping member; and
- means for rotating the liner tube around the axis.

As used herein the phrase "superposed position" means the peripheral surface of the scraping member either contacts, or is positioned so that only a small gap exists between the scraping member and the reactor inner surface or liner inner surface. Typically and preferably the scraping member peripheral surface contacts the reactor inner surface or liner inner surface, with embodiments wherein a gap exists being less preferable since cleaning effectiveness may decrease as the gap distance increases.

The phrase "means for causing relative revolving movement between the inner surface and the elongate scraping member" as used herein means that substantially all (preferably all) of the inner wall of the reactor or liner is traversed by the peripheral surface of the scraping member.

The first end of the elongate passageway defined by the inner surface allows entrance of fibrous materials which are to be coated by gaseous compositions by CVD. Means for introducing into the passageway a gaseous mixture adapted to deposit a coating on the inorganic fibrous substrate are also provided, typically more than one.

Preferably, the reactor assembly has a uniform inside diameter, but in all embodiments is of sufficient size to receive a liner. In embodiments wherein the reactor assembly comprises a fixed elongate outer tube having a longitudinal axis and an inner elongate liner tube having the inner surface, there is provided means for mounting the liner tube within the opening in the outer tube for rotational movement around the axis relative to the outer tube and to the scraping member.

A small-diameter rod extending axially through the second end of the reactor assembly and resting against the inner surface of the liner is one preferred apparatus within the invention. One particularly preferred apparatus within the invention includes means for counter-rotating each of the liner and the scraping member, and means for periodically reversing their directions of rotation.

Another aspect of the invention is a method of removing extraneous debris from a continuously operated chemical vapor deposition reactor adapted to coat an elongate inorganic fibrous substrate by chemical vapor deposition. The method comprises the steps of:

- providing a reactor assembly having an inner surface defining an elongate through passageway, the elongate passageway having an axis and opposite axially spaced first and second ends;
- progressively moving the elongate inorganic fibrous substrate axially through the elongate passageway from the first end toward the second end;
- introducing into the passageway a gaseous mixture adapted to deposit a coating on the inorganic fibrous substrate;
- providing an elongate scraping member having a peripheral surface and extending axially of the passageway along one side of the inner surface with a longitudinally extending portion of the peripheral surface of the scraping member in superposed position relative to a longitudinal axially extending portion of the inner surface; and
- causing relative revolving movement between the inner surface and the elongate scraping member around the axis of the passageway to progressively change the longitudinal axially extending portion of the inner surface on which is superposed the scraping member to cause extraneous debris along the inner surface to be progressively scraped away by the scraping member.

Preferred are those methods wherein the scraping member moves or, more preferably, rotates about its longitudinal axis or revolves about the elongate through passage way axis. Also preferred are those methods wherein both the inner surface and scraping member rotate, particularly those methods wherein the reactor assembly is in the form of inner and outer elongate tubes (as in the above described apparatus of the invention), and wherein the direction of rotation of the furnace tube liner and scraping means are periodically reversed.

Those methods wherein the longitudinal axis of the reactor assembly is tilted at an angle to horizontal are preferred, although benefits are achieved when the angle of the reactor assembly to horizontal is anywhere between 0° and 90° to horizontal. It has been found that the angle of the reactor assembly to horizontal should preferably range from about 30° to about 60° for best cleaning results.

As with the parent application, the apparatus of the present invention permits an elongate inorganic fibrous material to be moved axially continuously through a reactor assembly in the presence of at least one gas or gaseous reagent. Whether operating at atmospheric or subatmospheric pressure, the residue of the gaseous reagents (i.e., inert carrier gases, nonreacted gaseous reagents, other non-deposited gaseous by-products, and entrained soot particles) are exhausted from the apparatus at the axially spaced second end. At that end of the reactor assembly, back-diffusion of the air is kept at acceptable levels by the flux of the effluent gases. When operating the inventive apparatus at atmospheric pressure, the in-diffusion of air through the first end (inlet) of the reactor assembly can be kept at acceptable levels by using long, small-diameter tubing connected to the first end of the reactor assembly. When that tubing has a uniform, slot-like cross-sectional area, a plurality of tows, rovings or yarns can be moved side-by-side through the inventive reactor assembly without crowding. A slot-like reactor assembly inlet is also useful for coating strips of woven or nonwoven fabric.

With the self-cleaning aspects presented herein, loose filaments of the fibrous material that become attached to the innermost surface of the reactor assembly are broken away from those areas by the relative movement of the inner surface and superposed scraping member. One or both of the reactor assembly innermost surface and scraping member may move, depending on the embodiment desired. These filaments and fuzzballs become attached to the moving fibrous material and are carried out of the apparatus. The relative movement of scraping member surface and inner surface of the liner or reactor assembly also pushes any soot to the side. By tilting the reactor assembly at an angle to horizontal with its second (outlet) end inclined downward, much of the extraneous debris exits by gravity from the reactor assembly. To better prevent fibrous material from being wound onto the scraping member, in preferred embodiments the direction of rotation of the liner and scraping member are periodically reversed. Each of the liner and/or scraping member (depending upon the embodiment) preferably complete one rotation (more preferably substantially simultaneously if both rotate) every 10 to 60 seconds. At a substantially lower rotation rate, there would be more time for loose filaments to become rigidified by CVD coatings, possibly damaging the fibrous material by friction and catching and breaking away filaments from the advancing fibrous material. A substantially faster rotation would increase friction between the reactor assembly and liner outer surface, without any compensating advantage.

The outer elongate tube (sometimes referred to herein as a "furnace tube") preferably has a length ranging from 25 to 50 centimeters ("cm"). At shorter lengths, some CVD reactions may not yet have reached equilibrium at the outlet, and thus the maximum possible deposit may not yet have formed. Lengths substantially greater than that range would make rotation of the liner more difficult, without any appreciable offsetting advantage. The inner elongate liner tube, when used, is preferably approximately the same length as the outer elongate furnace tube.

The inner surface of the reactor assembly preferably has a uniform inside diameter. When an outer elongate tube/inner elongate liner tube arrangement is used, the inside diameter of the liner tube is limited by the diameter of the furnace tube. The inside diameter of the liner tube preferably ranges from 2 to 25 cm, most preferably from 2 to 5 cm. Coating of tow is typically performed using smaller diameters, while larger diameters are used for coating fabrics. A substantially cylindrical liner tube can be easily replaced simply by pulling it through the outlet of the outer tube without disassembling the reactor assembly of the invention.

The scraping member, if in the form of an elongate rod, is preferably a glass or quartz rod of small diameter, preferably having as small a diameter as possible while having sufficient strength and sufficient mass to stay in superposed position relative to the inner surface of the reactor assembly or liner. A currently preferred range of diameters for a rod-like scraping member is from 0.4 to 0.8 cm. By having small diameter, the rod does not significantly reduce the cross-sectional area through which the fibrous material passes.

Further aspects and advantages of the invention will become apparent from reviewing the drawing and reading the description of preferred embodiments which follow.

BRIEF DESCRIPTION OF THE DRAWING

The FIG. 1 is a schematic side elevation of the coating apparatus of the invention.

DESCRIPTION OF PREFERRED EMBODIMENTS

Figure 1:
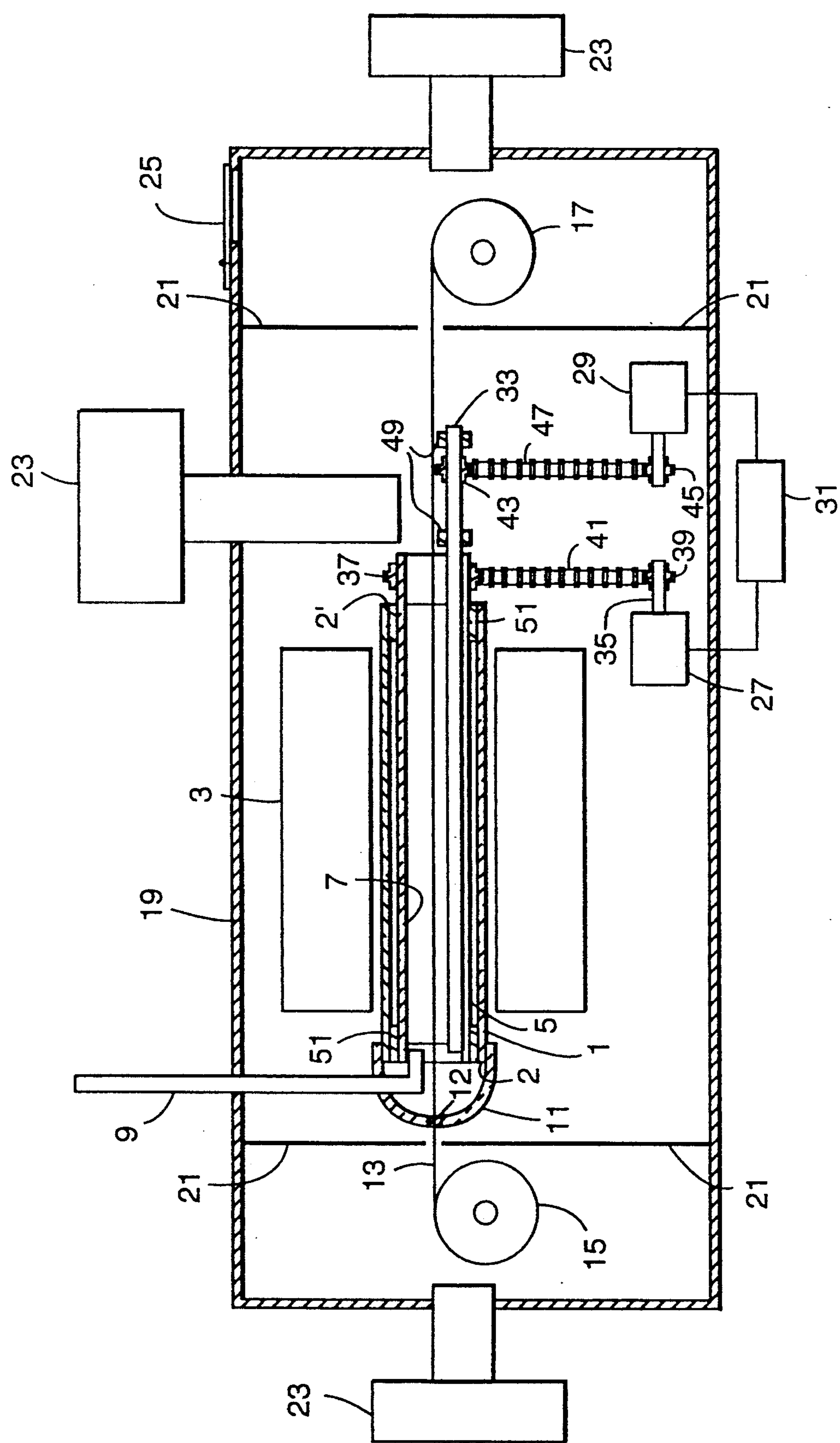

Illustrated schematically in FIG. 1 is an apparatus in accordance with the invention. The apparatus illustrated has an elongate cylindrical outer tube (furnace tube) 1 having an inlet end 2 and an outlet end 2' which is preferably quartz, refractory ceramic, high temperature stable glass; electric resistance or induction heating element 3, which for some CVD processes may not be required; and an optional elongate inner liner tube 5 having an inner surface 7, liner tube 5 also preferably made of quartz, refractory ceramic, or high temperature stable glass. One gaseous material intake conduit 9 is illustrated to provide for the introduction of gaseous reagents and/or inert gases, it being understood that multiple intake conduits 9 could be provided. A furnace tube seal cap 11 (preferably quartz) forces the gas stream(s) to flow through elongate liner tube 5, an opening 12 allowing the passage of fibrous material (in this embodiment tow 13) into the elongate passage defined by inner surface 7. Tow 13 unwinds from a supply spool 15, proceeds into the furnace tube through opening 12, becomes coated by a coating of reacted reactant gases by CVD, proceeds optionally through a spare liner tube(s) (not shown) and is taken up on a windup spool 17.

Where the coating is deposited at subatmospheric pressure, the apparatus is enclosed in a vacuum chamber 19. Baffles 21 serve for the near total isolation of spools 15 and 17. One or more vacuum pumps 23 may be used in the apparatus, and illustrated in FIG. 1 are three vacuum pumps 23. When it is desired to operate the apparatus at atmospheric pressure, vent 25 may be opened to a venting system.

Near the point where gases exit liner tube 5 are a pair of timed reversible AC motors 27 and 29 (and a speed controller and timer 31) by which liner tube 5 and a rod 33, respectively, can be reversibly counter-rotated. To do so, the end of liner tube 5 extending axially out of the furnace tube, and a shaft 35 on motor 27 are fitted with sprocket teeth 37 and 39, respectively, and a link chain 41, while rod 33 and motor 29 are likewise fitted with sprocket teeth 43 and 45, respectively, and a link chain 47. Rod 33 rotates on a set of bearings 49 and liner 5 rotates on a set of quartz or refractory ceramic bearings 51.

The asymmetric buildup of extraneous materials on liner tube inner surface 7 along the longitudinal axis of liner 5 prevents uniform contact along the axis between scraping rod 33 and inner surface 7. Also, this buildup constricts the free cross-sectional area of liner 5, thereby increasing contact between tow 13 and inner surface 7. Liner 5 may then be pulled out of the furnace tube and broken away, after which a spare liner can be moved into operative position, all without disturbing tow 13. To do so, it is necessary only to disconnect the chain drives 41 and 47, remove rod 33, and then reconnect them after moving the spare liner into position. If desired, the tow could pass through additional spare liners before reaching take-up spool 17.

The scraping member of the invention may have any one of a variety of shapes, sizes, and cross-sections although, as stated previously, small diameter rods are preferred so that the flow of gases and/or fibrous substrate is not disturbed. The scraping member, if generally in the form of an elongate member protruding into the furnace tube, may have a round, square, rectangular, triangular, trapezoidal, multilobal cross-section, or a combination of these. Alternatively, the scraping member may be a substantially flat plate or taurus (i.e. doughnut-shaped), having one or more apertures through which the fibrous material, gaseous materials, and extraneous debris may pass. In these embodiments, the outer peripheral edge of the plate or taurus is superposed relative to the inner surface of the furnace tube or liner tube as the case may be. In these embodiments, the flat plate or taurus would be moved axially along the longitudinal axis of the reactor assembly.

The scraping member should have sufficient stiffness strength to operate at the temperatures of the CVD process, and sufficient chemical inertness to operate in corrosive CVD atmospheres. Suitable materials include quartz, high temperature stable glass (such as that known under the trade designation "Pyrex"), various steels, including plain carbon steels, stainless steels, and various metal alloys.

The scraping member, especially when in the shape of an elongate member, may have protrusions such as nobs or paddles extending generally perpendicular to the longitudinal axis of the scraping member which facilitate the removal of extraneous material from the furnace tube or liner tube inner surface. A scraping member wherein the peripheral edge defines a screw thread having a plurality of vanes may be particularly useful wherein it is desired to operate a CVD reactor horizontally or substantially horizontally. Extraneous material may then be augured by the vanes toward the outlet of the furnace tube liner and removed from the assembly. When operated in this mode, the periodic reversal of the direction of rotation, which is preferred in other embodiments, is omitted.

The furnace tube liner, when used, is preferably "substantially cylindrical", meaning that it has a cross-section that is preferably cylindrical but may be any cross-section which allows relative movement of scraping member and the innermost surface of the reactor assembly (i.e., that surface whereon soot and fuzzballs deposit). The furnace tube or liner tube may have recessed areas (sections having larger diameter than the balance of the furnace tube or liner tube), in which case the scraping member may have protrusions or flaps extending substantially perpendicularly to the scraping member longitudinal axis of sufficient length to clean these areas, although care must be taken to avoid hitting the fibrous material. As discussed above, the furnace tube liner is preferably quartz, but may comprise many of the same materials mentioned previously for the scraping member.

At present the most efficient mode of actuating relative movement of the liner tube and scraping member is by the use of electric motors, although it can easily be assumed that other means could be used, such as pneumatic machines. In embodiments wherein both the liner tube and the scraping member move, it is conceivable to use one power source to actuate liner movement and a different type of power source to actuate the scraping member.

Even though the soot and fuzzball problem is most pronounced in the high temperature CVD coating process, it goes without saying that the present invention may also be used to remove any extraneous material that may form in low temperature CVD coating of fibrous material, including organic fibrous material.

The method of the invention will be further described with reference to the following specific examples, which should not be considered as limiting the scope of the invention.

EXAMPLE 1

Four 2,000-denier, 760-filament tows (ceramic fiber tows consisting essentially of mullite and 2 weight % $B_2O_3$, known under the trade designation "NEXTEL 480", form Minnesota Mining and Manufacturing Co., St. Paul, Minn.) were pulled through an apparatus similar to that of FIG. 1 at 30 cm/min with the furnace at 1,050° C. External to the reactor assembly, nitrogen was passed through triethyl borane at 1,670 $cm^3$/min, and then the combined nitrogen/borane gas stream was mixed with a separate stream of nitrogen flowing at 420 $cm^3$/min and that mixture introduced into liner 5 through intake 9. Through a second intake 9 (not shown) was introduced 1,650 $cm^3$/min $NH_3$. A purging stream of nitrogen (1430 $cm^3$/min) was also added.

Each of liner 5 and rod 33 made a complete rotation every 14 seconds and then was reversed. Loose filaments previously connected to the liner were broken away by the action of the liner and rod, attached themselves to the tows, and were carried out of the liner. The coating process was pursued without interruption for four hours and was only terminated due to time constraints. No manual cleaning was necessary.

The filaments became coated with boron nitride (BN) and remained flexible.

COMPARATIVE EXAMPLE A

The procedure of Example 1 was repeated except that the self-cleaning arrangement (liner and rod) was omitted. To avoid partial depletion of the reactants and partial blockage and damage to the tows, the fuzz and soot had to be manually removed at least every 20 minutes.

As judged by color to the naked eye, and by the intensity and color of the bright lines in cross-polarized light, relatively good coating thickness distribution was obtained in both Example 1 and Comparative Example A.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A self-cleaning apparatus for coating an elongate inorganic fibrous substrate by chemical vapor deposition, said apparatus comprising:

a chemical vapor deposition reactor assembly having an inner surface defining an elongate through passageway, said elongate passageway having an axis and opposite axially spaced first and second ends;

means for progressively moving said elongate inorganic fibrous substrate axially through said elongate passageway from said first end toward said second end;

means for introducing into said passageway a gaseous mixture adapted to chemically vapor deposit a coating on said inorganic fibrous substrate;

an elongate scraping member having a peripheral surface and extending axially of said passageway along one side of said inner surface with a longitudinally extending portion of the peripheral surface of said scraping member in superposed position relative to a longitudinal axially extending portion of said inner surface; and means for causing relative revolving movement between said inner surface and said elongate scraping member around the axis of said passageway to progressively change the longitudinal axially extending portion of said inner surface on which is superposed the scraping member to cause extraneous debris along said inner surface to be progressively scraped away by said scraping member.

2. A self-cleaning apparatus according to claim 1 wherein said inner surface is generally cylindrical, and said reactor assembly comprises a fixed elongate outer tube having opposite ends and a through opening around said axis axially extending between said ends, an elongate liner tube having said inner surface, means for mounting said liner tube within the opening in said outer tube for rotational movement around said axis relative to said outer tube and to said scraper, and means for rotating said liner tube around said axis.

3. A self-cleaning apparatus according to claim 2 wherein said liner tube has an outer surface and includes a projecting portion projecting from one end of said outer tube and a plurality of spaced axially projecting sprocket teeth around the outer surface of said projecting portion, and said apparatus further including a link chain in driving engagement with a portion of said sprocket teeth and means for driving said chain to provide said means for rotating said liner tube around said axis.

4. A self-cleaning apparatus according to claim 2 wherein said scraping member is generally cylindrical about a scraping member axis, and said apparatus further includes means for rotating said scraping member about said scraping member axis to continually change the longitudinally extending portion of the peripheral surface of said scraping member superposed on said inner surface.

5. A self-cleaning apparatus according to claim 1 wherein said scraping member is generally cylindrical about a scraping member axis, and said apparatus further includes means for rotating said scraping member about said scraping member axis to continually change the longitudinally extending portion of the peripheral surface of said scraping member superposed on said inner surface.

6. A self-cleaning apparatus according to claim 5 wherein the peripheral surface of said scraping member defines a screw thread so that rotation of said scraping member by said means for rotating augers extraneous debris removed from along said inner surface toward one end of said passageway.

7. A self-cleaning apparatus according to claim 1 wherein said reactor assembly has an outer surface and is transparent to thermal energy between said outer and inner surfaces, and said apparatus further includes means for heating portions of the elongate inorganic fibrous substrate and said gaseous mixture disposed along the outer surface of said reactor assembly.

8. Apparatus in accordance with claim 2 wherein said elongate liner tube has a diameter ranging from about 2 to 25 centimeters.

9. Apparatus in accordance with claim 1 wherein said elongate liner tube has a diameter ranging from about 2 to 5 centimeters.

10. Apparatus in accordance with claim 2 wherein said elongate liner tube has a length ranging from about 25 to about 50 centimeters.

11. Apparatus in accordance with claim 1 wherein said elongate scraping member is a cylindrical rod having a diameter ranging from about 0.4 to about 0.8 centimeter.

12. Apparatus in accordance with claim 2 including means for periodically counter-rotating the elongate liner tube and scraping member.

13. Apparatus in accordance with claim 12 wherein said scraping means is a cylindrical rod having a diameter ranging from about 0.4 to about 0.8 cm.

14. A method of removing extraneous debris from a continuously operated chemical vapor deposition reactor adapted to coat an elongate inorganic fibrous substrate by chemical vapor deposition, said method comprising the steps of:

providing a chemical vapor deposition reactor assembly having an inner surface defining an elongate through passageway, the elongate passageway having an axis and opposite axially spaced first and second ends;

progressively moving the elongate inorganic fibrous substrate axially through the elongate passageway from the first end toward the second end;

introducing into the passageway a gaseous mixture adapted to chemically vapor deposit a coating on the inorganic fibrous substrate;

providing an elongate scraping member having a peripheral surface and extending axially of the passageway along one side of the inner surface with a longitudinally extending portion of the peripheral surface of the scraping member in superposed position relative to a longitudinal axially extending portion of the inner surface; and causing relative revolving movement between the inner surface and the elongate scraping member around the axis of the passageway to progressively change the longitudinal axially extending portion of the inner surface on which is superposed the scraping member to cause extraneous debris along the inner surface to be progressively scraped away by the scraping member.

15. A method according to claim 14 wherein the inner surface is generally cylindrical and the reactor assembly comprises a fixed elongate outer tube having opposite ends and a through opening around said axis axially extending between said ends, an elongate liner tube having said inner surface, and means mounting said liner tube within the opening in said outer tube for rotational movement around said axis relative to said outer tube and to said scraping member, and said causing step comprises rotating said liner tube around said axis.

16. A method according to claim 15 wherein said liner tube has an outer surface and includes a projecting portion projecting from one end of said outer tube and a plurality of spaced axially projecting sprocket teeth around the outer surface of said projecting portion, and the apparatus further includes a link chain in driving engagement with a portion of the sprocket teeth, and said causing step comprises driving said chain to rotate said liner tube around said axis.

17. A method according to claim 14 wherein said scraping member is generally cylindrical about a scraping member axis, and said method further includes the step of rotating the scraping member about said scraping member axis to continually change the longitudinally extending portion of the peripheral surface of said scraping member in superposed position relative to said inner surface.

18. A method according to claim 17 wherein the peripheral surface of the scraping member defines a screw thread so that the step of rotating the scraping member augers extraneous debris removed from along said inner surface toward one end of said passageway.

19. A method according to claim 14 wherein said reactor assembly has an outer surface and is transparent to thermal energy between said outer and inner surfaces, and said method further includes the step of heating portions of the elongate inorganic fibrous substrate and said gaseous mixture through the reactor assembly.

20. A method according to claim 14 wherein said method further includes inclining the reactor assembly with one end lower than the other end so that gravity will cause extraneous debris scraped away from the inner surface by said causing step to move toward and out the lower end of the reactor assembly.

21. A method according to claim 15 wherein said scraping member is generally cylindrical about a scraping member axis, and said method further includes the step of rotating the scraping member about said scraping member axis to continually change the longitudinally extending portion of the peripheral surface of said scraping member in superposed position relative to said inner surface.

22. A method according to claim 21 wherein said method further includes periodically reversing the rotational movement of said scraping member and said elongate liner tube.

23. A self-cleaning apparatus for coating inorganic fibrous substrates by chemical vapor deposition, the apparatus comprising:

a chemical vapor deposition reactor assembly having an inner surface defining an elongate through passageway, said elongate passageway having an axis and opposite axially spaced first and second ends;

means for progressively moving said elongate inorganic fibrous substrate axially through said elongate passageway from said first end toward said second end;

means for introducing into said passageway a gaseous mixture adapted to chemically vapor deposit a coating on said inorganic fibrous substrate;

an elongate scraping member having a peripheral surface and extending axially of said passageway along one side of said inner surface with a longitudinally extending portion of the peripheral surface of said scraping member in superposed position relative to a longitudinal axially extending portion of said inner surface; and means for causing relative revolving movement between said inner surface and said elongate scraping member around the axis of said passageway to progressively change the longitudinal axially extending portion of said inner surface on which is superposed the scraping member and cause extraneous debris along said inner surface to be progressively scraped away by said scraping member, wherein said inner surface is generally cylindrical, and said reactor assembly comprises a fixed elongate outer tube having opposite ends and a through opening around said axis axially extending between said ends, an elongate liner tube having said inner surface, means mounting said liner tube within the opening in said outer tube for rotational movement around said axis relative to said outer tube and to said scraper, and means for rotating said liner tube around said axis.

* * * * *